(12) United States Patent
Teboulle et al.

(10) Patent No.: US 12,140,616 B2
(45) Date of Patent: Nov. 12, 2024

(54) ESTIMATION, DESPITE A FRAUD, OF THE POWER CONSUMED ON A PHASE

(71) Applicant: SAGEMCOM ENERGY & TELECOM SAS, Rueil Malmaison (FR)

(72) Inventors: Henri Teboulle, Rueil Malmaison (FR); Sébastien Noiret, Rueil Malmaison (FR)

(73) Assignee: SAGEMCOM ENERGY & TELECOM SAS, Rueil Malmaison (FR)

( * ) Notice: Subject to any disclaimer, the term of this patent is extended or adjusted under 35 U.S.C. 154(b) by 182 days.

(21) Appl. No.: 17/852,781

(22) Filed: Jun. 29, 2022

(65) Prior Publication Data
US 2022/0413023 A1   Dec. 29, 2022

(30) Foreign Application Priority Data
Jun. 29, 2021   (FR) .................................. FR2107012

(51) Int. Cl.
*G01R 22/06*   (2006.01)
(52) U.S. Cl.
CPC ................................. *G01R 22/066* (2013.01)
(58) Field of Classification Search
CPC .. G01R 11/30–56; G01R 22/00; G01R 22/06; G01R 22/061; G01R 22/066; G01R 22/10
See application file for complete search history.

(56) References Cited

U.S. PATENT DOCUMENTS

| | | | |
|---|---|---|---|
| 6,236,197 B1 | 5/2001 | Holdsclaw et al. | |
| 2009/0315535 A1* | 12/2009 | Lee, Jr. ................ | G01R 22/066 324/110 |
| 2012/0245869 A1* | 9/2012 | Ansari ................... | G01R 11/24 702/62 |
| 2012/0306290 A1 | 12/2012 | Fanget | |
| 2020/0142373 A1* | 5/2020 | Stoner ...................... | H02J 3/00 |

FOREIGN PATENT DOCUMENTS

| | | |
|---|---|---|
| EP | 0455518 A2 | 11/1991 |
| FR | 2991057 A1 | 11/2013 |

* cited by examiner

*Primary Examiner* — Alvaro E Fortich
*Assistant Examiner* — David B Frederiksen
(74) *Attorney, Agent, or Firm* — Muncy, Geissler, Olds & Lowe, P.C.

(57) ABSTRACT

Power estimation method, implemented in a three-phase electricity meter, includes the steps of detecting a fraud which falsifies measurements of a first phase voltage present on a first phase, without falsifying measurements of a second phase voltage present on a second phase; reconstituting first estimated voltage samples, images over time of the first phase voltage, from second voltage samples, images over time of the second phase voltage; and estimating at least one first electrical power consumed on the first phase by using the first estimated voltage samples.

15 Claims, 3 Drawing Sheets

ESTIMATION, DESPITE A FRAUD, OF THE POWER CONSUMED ON A PHASE

The invention relates to the field of three-phase electricity meters.

BACKGROUND OF THE INVENTION

Electricity meters, used in industrial applications, frequently measure powers and electrical energies which are distributed via very high current levels (up to 2000 A, typically). These meters are generally three-phase meters.

Such a meter comprises current inputs and voltage inputs.

Current sensors, for example Rogowski sensors or external current transformers, are conventionally mounted on the phases. Each current sensor is connected to a current input by two conductive wires. The meter thus acquires, for each phase, an image of the current circulating on said phase.

Each voltage input is conventionally connected to a phase by a conductive wire. The meter thus directly accesses the voltage present on each phase via the associated conductive wire.

A known fraud consists of cutting one or more of the conductive wires which connect the phases to the voltage inputs. The aim of such a fraud is to underevaluate the total energy consumed which is measured by the meter, so as to reduce the bill to be paid to the electricity energy distributor.

In case of fraud, the meters of the prior art continue to take metrological measurements as such on the three phases, without considering fraud, and therefore actually underevaluate the energy consumed. Even if fraud is detected, the distributor does not know the energy actually consumed by the installation of the fraudster. Yet, it can prove to be useful to know the energy actually consumed, for example to reclaim from the fraudster the payment of the energy riot billed (in addition to possible penalties aiming to sanction the fraud attempt).

OBJECT OF THE INVENTION

The invention aims to estimate, despite a fraud consisting of falsifying voltage measurements on a phase, the total energy consumed by an installation.

SUMMARY OF THE INVENTION

In view of achieving this aim, a power estimation method is proposed, implemented in a three-phase electricity meter, and comprising the steps of:
  detecting a fraud which falsifies measurements of a first phase voltage present on a first phase of a distribution network, without falsifying measurements of a second phase voltage present on a second phase of the distribution network;
  reconstituting first estimated voltage samples, images over time of the first phase voltage, from second voltage samples, images over time of the second phase voltage, the second voltage samples being offset over time by an expected theoretical phase shift without fraud between the first phase voltage and the second phase voltage;
  estimating at least one first electrical power consumed on the first phase by using the first estimated voltage samples.

When a fraud is detected on the first phase, the measurements of the first phase voltage are falsified and are not therefore usable.

The power estimation method according to the invention therefore replaces the measurements of the first phase voltage by first estimated samples which are reconstituted from measurements of the second phase voltage which, themselves, are not falsified by fraud.

The method then estimates the first electrical powers consumed on the first phase by using the first estimated voltage samples.

The energy distributor can therefore obtain, despite the fraud, a relatively precise estimation of the total electrical powers and of the total energy actually consumed by the installation.

In addition, a power estimation method such as described above is proposed, in which the reconstitution comprises the steps of acquiring a first index offset corresponding to the expected theoretical phase shift and, for each first estimated voltage sample associated with a first index:
  if the first index offset is an integer, to confer to the first estimated voltage sample, a value of a second voltage sample having, as second index, the first index offset from the first index offset;
  otherwise, to confer to the first estimated voltage sample, an estimated value obtained from an interpolation using at least one second voltage sample.

In addition, a power estimation method such as described above is proposed, in which the first index offset $\Delta 1$ such that:

$$\Delta 1 = 2N/3 \text{ or } \Delta 1 = N/3,$$

where N is a number of first voltage samples per period of the first phase voltage,
and in which, if $\Delta 1$ is an integer, the following occurs:

$$U_{1_n} = V_{2_{n-\Delta 1}}.$$

In addition, a power estimation method such as described above is proposed, comprising the step, if $\Delta 1$ is not an integer, of calculating the estimated value by performing a linear interpolation between the second voltage sample $V_{2_{n-INT(\Delta 1)-1}}$ and the second voltage sample $V_{2_{n-INT(\Delta 1)}}$, INT being the integer part function.

In addition, a power estimation method such as described above is proposed, in which the reconstitution comprises the steps of:
  acquiring a prerecorded reference table and containing reference samples of a sinusoidal signal;
  measuring a maximum value of the second phase voltage and multiplying the reference samples by an amplitude factor proportional to the maximum value for obtaining resulting reference samples, and
  for each first estimated voltage sample associated with a first index, conferring to the first estimated voltage sample, a value of a resulting reference sample having as an index, the first index offset from an index offset corresponding to the expected theoretical phase shift without fraud between the first phase voltage and the second phase voltage.

In addition, a power estimation method such as described above is proposed, in which the at least one first electrical power comprises a first Active Power estimated from first estimated voltage samples and from first current samples, images over time of a first phase current circulating on the first phase, and/or a first Reactive Power estimated from samples of a level on a fundamental frequency of the first phase voltage and from samples of a level on a fundamental frequency of the first phase current, and/or a first Apparent. Power estimated from an effective value of the first phase voltage and from an effective value of the first phase current.

In addition, a power estimation method such as described above is proposed, in which the samples of the level on the fundamental frequency of the first phase voltage and the samples of the level on the fundamental frequency of the first phase current are obtained by application of a low-pass filtering respectively on the first estimated voltage samples and on the first current samples.

In addition, a power estimation method such as described above is proposed, in which the low-pass filtering is a first-order Butterworth filter having a Z transform H(Z) such that:

$$H(Z) = \frac{1+Z^{-1}}{1-a.Z^{-1}}, \text{ with:}$$

$$a = 0.7569801925.$$

In addition, a power estimation method such as described above is proposed, further comprising the steps, if the fraud also falsifies measurements of a third phase voltage, present on a third phase, to again use the second voltage samples to reconstitute third voltage samples, images over time of the third phase voltage, and to estimate at least one third electrical power consumed on the third phase by using the third estimated voltage samples.

In addition, a power estimation method such as described above is proposed, further comprising the steps of detecting if the distribution network comprises, or not, a neutral in addition to three phases, and if this not the case, of calculating second corrected voltage samples and of calculating at least one second corrected electrical power consumed on the second phase from second corrected voltage samples.

In addition, a power estimation method such as described above is proposed, in which the calculation of the second corrected voltage samples comprises the steps of acquiring a second index offset corresponding to an expected theoretical phase shift for the measurements of the second phase voltage due to fraud, of multiplying the second voltage samples by a predetermined factor to obtain second resulting samples and, for each second corrected voltage sample associated with a second corrected index:
- if the second index offset is an integer, of conferring to the second corrected voltage sample, a value of a second resulting voltage sample having, as a second corrected index offset from the second index offset;
- otherwise, of conferring to the second corrected voltage sample, an estimated value obtained from an interpolation using at least one second resulting voltage sample.

In addition, a power estimation method such as described above is proposed, in which an absence of a neutral is detected when an angle $\varphi$ between the second phase voltage and the third phase voltage is such that:

$$180°-X° < |\varphi| < 180°+X°,$$

X being a positive predefined value and less than 30.

In addition, a power estimation method such as described above is proposed, in which fraud is detected when the first phase voltage is less than a predefined voltage threshold, while the first phase current is greater than a predefined current threshold.

In addition, a three-phase electricity meter is proposed, comprising a processing component arranged to implement the power estimation method such as described above.

In addition, a computer program is proposed, comprising instructions which drive the processing component of the three-phase electricity meter such as described above to execute the steps of the power estimation method such as described above.

In addition, a recording media which can be read by a computer is proposed, on which the computer program is recorded, such as described above.

The invention will be best understood in the light of the following description of particular non-limiting embodiments of the invention.

BRIEF DESCRIPTION OF THE DRAWINGS

Reference will be made to the accompanying drawings, among which.

DETAILED DESCRIPTION OF THE INVENTION

Figure 1:
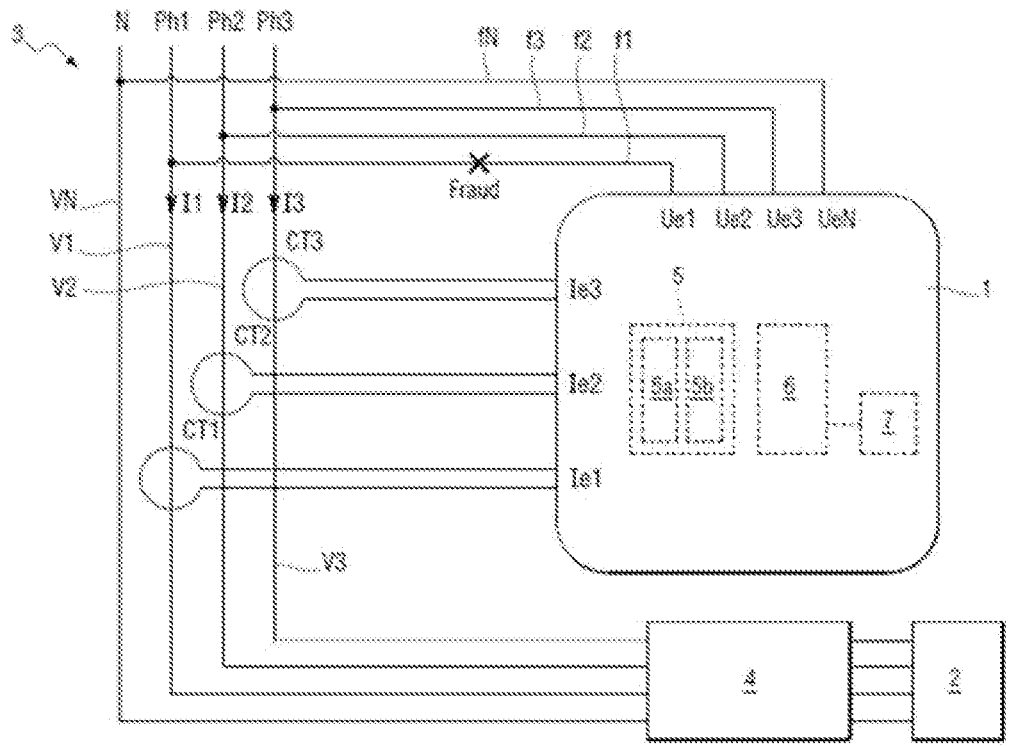
FIG. 1 represents a three-phase electricity meter according to the invention, in a four-wire configuration.

In reference to FIG. 1, the power estimation method according to a first embodiment of the invention is implemented in a three-phase electricity meter 1 which is intended to measure the electrical energy supplied to the installation 2 of a subscriber by a distribution network 3. This installation 2 is an industrial installation.

In this case, this is a four-wire configuration.

The distribution network 3 therefore comprises a first phase Ph1, a second phase Ph2, a third phase Ph3 and a neutral N. A circuit breaker 4 is positioned "at the border" between the distribution network 3 and the installation 2. The three phases Ph1, Ph2, Ph3 and the neutral N enter into the circuit breaker 4 and emerge from it toward the installation 2. The circuit breaker 4 enables to cut the electrical energy distribution.

The meter 1 comprises four voltage inputs Ue1, Ue2, Ue3, UeN and three current phases Ie1, Ie2, Ie3 (each current input comprising two ports).

The voltage input is connected to the first phase Ph1 by a conductive wire f1, the voltage input Ue2 is connected to the second phase Ph2 by a conductive wire f2, the voltage input. Ue3 is connected to the third phase Ph3 by a conductive wire f3 and the voltage input UeN is connected to the neutral N by a conductive wire fN.

The current input Ie1 is connected to an external current transformer CT1 mounted on the first phase Ph1, the current input Ie2 is connected to an external current transformer CT2 mounted on the second phase Ph2, and the current input Ie3 is connected to an external current transformer CT3 mounted on the third phase Ph3. The external current transformers are located outside of the meter 1.

Each external current transformer has, in this case, a transformation ratio equal to 2000.

To achieve the metrological measurements, the meter 1 collects, at the current inputs Ie1, Ie2, Ie3, and thanks to the external transformers CT1, CT2 and CT3, an image of the phase currents I1, I2, I3 circulating on the phases Ph1, Ph2 and Ph3. The meter 1 also collects, on the voltage inputs Ue1, Ue2, Ue3 and UeN, the phase voltages V1, V2, V3 present on the phases Ph1, Ph2, Ph3 and the neutral voltage VN present on the neutral N.

The meter 1 in addition comprises measuring components 5 comprising front components 5a and analogue-to-digital converters 5b (or one single analogue-to-digital converter having a sufficient number of inputs).

The front components 5a are connected to the current inputs and to the voltage inputs. The front components 5a enable to transform the currents on the current inputs into voltages adapted to the analogue-to-digital converters 5b.

The front components 5a also enable to transform the voltages on the voltage inputs adapted to the analogue-to-digital converters 5b.

The meter 1 in addition comprises a processing component 6.

The processing component 6 is adapted to executing instructions of a program to implement the power estimation method according to the invention. The program is stored in a memory 7, which is integrated in or connected to the processing component 6. The processing component 6 is, for example, a conventional processor, a microcontroller, a DSP (Digital Signal Processor), or a programmable logic circuit such as an FPGA (Field Programmable Gate Array) or an ASIC (Application Specific Integrated Circuit).

In this case, the processing component 6 is a microcontroller 6.

The microcontroller 6 is connected to the analogue-to-digital converters 5b and acquires the measurement samples produced by the analogue-to-digital converters 5b.

The microcontroller 6 thus acquires first voltage samples $V_{1_n}$ and first current samples $I_{1_n}$, images over time respectively of the first phase voltage 1 and of the first phase current I1. The microcontroller 6 also acquires second voltage samples $V_{2_n}$, and second current samples $I_{2_n}$, images over time respectively of the second phase voltage V2 and of the second phase current I2. The microcontroller also acquires third voltage samples $V_{3_n}$ and third current samples $I_{3_n}$, images over time respectively of the third phase voltage V3 and of the third phase current I3.

At regular intervals, the microcontroller 6 attempts to detect the fraudulent cutting of one or more conductive wires f1, f2, f3, which falsifies the measurements of one or more phase voltages. The microcontroller 6 detects a cutting of the conductive wire of a phase in the absence of voltage and in the presence of current on said phase.

For the first phase Ph1, for example, the microcontroller 6 detects a fraud when the first phase voltage is less than a predefined voltage threshold, while the first phase current is greater than a predefined current threshold.

The microcontroller 6 calculates, in this case, $V1_{RMS}$, which is the effective value of the first phase voltage V1, and $I1_{RMS}$, which is the effective value of the first phase current I1, and detects a fraud on the first phase Ph1 when:

$V1_{RMS}<Vf$ and $I1_{RMS}>If$,

Vf being the predefined voltage threshold and If being the predefined current threshold.

Advantageously, If is chosen such that:

Istart<If<Imin,

Istart being the current value from which the meter 1 starts to measure the energy consumed, and Imin being the current value from which the meter 1 must measure the current with nominal precision.

In this case, the following occurs: Istart=1 mA and Imin=10 mA.

Therefore, for example, If=5 mA is chosen.

For example, Vf=40V is chosen.

This fraud detection step is carried out in the same way for the two other phases.

It is now assumed that the microcontroller 6 has detected a fraud on the first phase Ph1 (only).

The measurements of the first phase voltage V1 are therefore falsified by the fraud, and the first voltage samples are not usable.

The microcontroller 6 will therefore estimate at least one first electrical power consumed on the first phase Ph1 by using the voltage measurements on a reference phase which does not suffer fraud. This reference phase is, in this case, for example the second phase Ph2 (but would also have been able to be the third phase Ph3).

For this, the microcontroller 6 reconstitutes first estimated voltage samples $U_{1_n}$, images over time of the first phase voltage V1, from second voltage samples $V_{2_n}$, images over time of the second phase voltage V2.

The reconstitution is done by successive measurement periods, each having, for example, a duration of 1 s.

Each phase voltage has a network frequency equal to 50 Hz, and therefore a network period equal to 20 ms.

N is noted for the number of samples per network period (N is therefore the number of first voltage samples per period of the first phase voltage), and σ the number of network periods per measurement period. In this case, the following occurs: σ=50. Therefore, there are σN samples per measurement period of 1 s.

Advantageously, N is a multiple of 4. In this case, for example, N=52.

The sampling frequency $f_E$ is therefore such that:

$f_E$=2600 Hz.

The microcontroller 6 first acquires a first index offset Δ1 corresponding to an expected theoretical phase shift without fraud between the first phase voltage V1 and the second phase voltage V2. The first index offset has been prerecorded in the memory 7. The expected theoretical phase shift is equal to +120°.

The first index offset Δ1 is a number of samples, of which the second voltage samples $V_{2_n}$ must be offset to produce a voltage in the phase with the first phase voltage V1, by considering the expected theoretical phase shift, and by considering that an index offset equal to the total number of samples per network period (that is N) would correspond to a phase shift of 360°.

In this case, the following occurs:

Δ1=2N/3.

For each first estimated voltage sample $U_{1_n}$, if the first index offset Δ1 is an integer, the microcontroller 6 confers to said first estimated voltage sample, a value of a second voltage sample having, as a second index, the first index n offset from the first index offset Δ1. Otherwise, the microcontroller 6 confers to the first estimated voltage sample $U_{1_n}$ value estimated from an interpolation using at least one second voltage sample.

Thus, if 2N/3 is an integer, the second voltage sample $V_{2_{n-2N/3}}$, exists and the microcontroller 6 considers that:

$U_{1_n}=V_{2_{n-2N/3}}$.

Therefore, the samples already known $V_{2_n}$ are used, but offset by ⅔ of network period over time.

However, if Δ1 is not an integer, $V_{2_{n-2N/3}}$ does not exist, and the microcontroller 6 uses at least one second existing voltage sample to produce an estimated value of the first estimated voltage sample $U_{1_n}$.

In this case, the microcontroller 6 calculates the estimated value by making a linear interpolation between the second voltage sample $V_{2_{n-INT(\Delta 1)-1}}$ and the second voltage sample $V_{2_{n-INT(\Delta 1)}}$, i.e. between $$V_{2_{n-INT\left(\frac{2N}{3}\right)-1}} \text{ and } V_{2_{n-INT\left(\frac{2N}{3}\right)}}.$$

INT is the "integer part" function.

The microcontroller 6 therefore determines the value of the sample $U_{1_n}$ at the precise moment $n-2N/3$.

Figure 2:
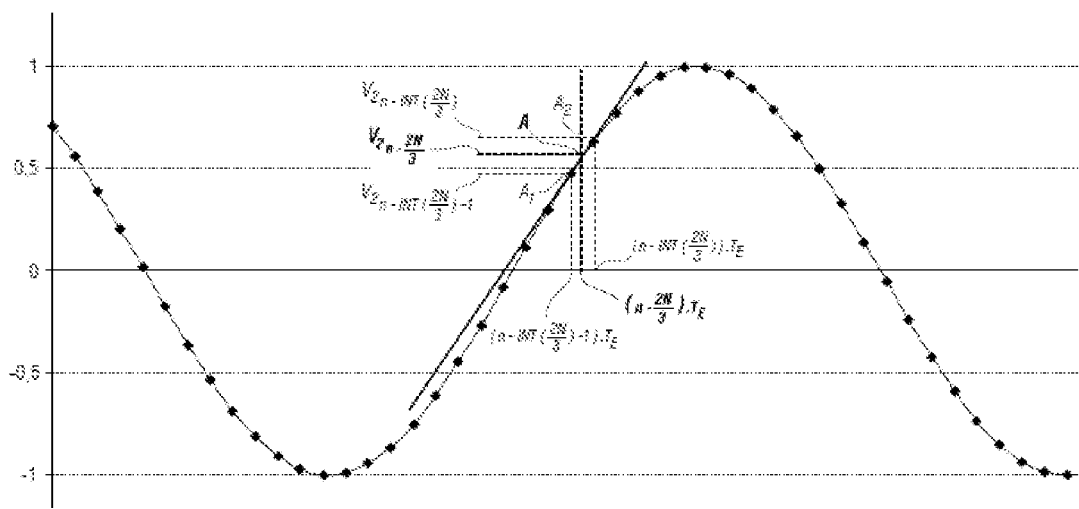
FIG. 2 represents a graph comprising a sinusoidal curve, and enables to illustrate a linear interpolation method.

In reference to FIG. 2, the time offset between each sample is, by definition, equal to $T_E$ (sampling period), that is 384.62 μs for $f_E$=2600 Hz.

The linear interpolation principle consists of estimating $$V_{2_{n-\frac{2N}{3}}}$$

corresponding to the point of the sinusoid at the moment $$\left(n - \frac{2N}{3}\right).$$

$T_E$ by approximating at the 1$^{st}$ order, the sinusoid by the tangent passing through the 2 points $A_1$ $$\left[\left(n - INT\left(\frac{2N}{3}\right) - 1\right).T_E; V_{2_{n-INT\left(\frac{2N}{3}\right)-1}}\right] \text{ and}$$

$$A_2\left[n - INT\left(\frac{2N}{3}\right).T_E; V_{2_{n-INT\left(\frac{2N}{3}\right)}}\right].$$

Thus, it is sought to determine the ordinate from the point A of coordinates $$\left[\left(n - \frac{2N}{3}\right).T_E; V_{2_{n-\frac{2N}{3}}}\right].$$

The equation of the tangent passing through these two points is of the type y=a.x+b and is very simple to determine. From this, $$V_{2_{n-\frac{2N}{3}}}$$

is deduced, corresponding to the ordinate on the tangent of the point A, the x axis of which of the tangent is $$\left(n - \frac{2N}{3}\right).T_E.$$

It is thus shown that:

$$V_{2_{n-\frac{2N}{3}}} = V_{2_{n-INT\left(\frac{2N}{3}\right)}} - \left(V_{2_{n-INT\left(\frac{2N}{3}\right)}} - V_{2_{n-INT\left(\frac{2N}{3}\right)-1}}\right) \times \left(\frac{2N}{3} - INT\left(\frac{2N}{3}\right)\right)$$

Here, in this case, 2N/3 is not an integer and the estimation by linear interpolation is done systematically to reconstitute each first estimated voltage sample.

Each second, the microcontroller 6 thus calculates a value of at least one first electrical power consumed on the first phase V1.

The at least one first electrical power calculated by the microcontroller 6 comprises, in this case, a first Active Power estimated from first estimated voltage samples $U_{1_n}$ and from first current samples $I_{1_n}$, a first Reactive Power estimated from sampes of a level on the fundamental frequency of the first phase voltage V1 and of samples of a level on the fundamental frequency of the first phase current I1, and a first Apparent Power estimated from an effective value of the first phase voltage V1 and from an effective value of the first phase current I1. The measurements of energy consumed over time derive from these power estimations.

In this case, the microcontroller 6 therefore calculates:

$$P_1 = \frac{1}{\sigma.N} \times \sum_{n=0}^{\sigma.N-1} U_{1_n} \times I_{1_n} \text{ (first Active Power)};$$

$$Q_1 = \frac{1}{\sigma.N} \times \sum_{n=0}^{\sigma.N-1} U_{F1_{n-N/4}} \times I_{F1_n} \text{ (first Reactive Power)};$$

$S_1 = V1_{RMS}.I1_{RMS}$ (first Apparent Power).

$U_{F1_n}$ is the nth sample of the level on the fundamental frequency of the first phase voltage V1.

$I_{F1_n}$ is the nth sample of the level on the fundamental frequency of the first phase current I1.

The values $V1_{RMS}$ and $I1_{RMS}$ are obtained by calculation from the samples $U_{1_n}$ and $I_{1_n}$.

It is therefore understood the interest that represents the choice of a number of samples N per multiple-of-4 network period, which enables to facilitate the calculation of the Reactive Power by simple offsetting of a quarter of a period of the samples of the level on the fundamental frequency of the first phase voltage V1.

The samples $U_{F1_n}$ of the level on the fundamental frequency of the first phase voltage V1 and the samples $I_{F1_n}$ of the level on the fundamental frequency of the first phase current I1 are obtained by a low-pass filtering respectively of the first estimated voltage samples $U_{1_n}$ (reconstituted) and of the first current samples $I_{1_n}$.

The low-pass filtering uses, in this case, a first-order Butterworth filter.

The Z transform of a first-order Butterworth filter is expressed by the relationship:

$$H(Z) = \frac{1 + Z^{-1}}{1 - aZ^{-1}} \text{ with } Z = e^{\frac{j.2.\pi.f}{f_E}}$$

Advantageously, in this case, the following is chosen:
a=0.7569801925,
which enables to obtain a cutoff frequency at 3 dB of 70 Hz when the network frequency $f_1$ is such that: $f_1$=50 Hz.

It is interesting to note that the network frequency $f_1$, knowing than he sampling frequency $f_E$ is such that $f_E = N.f_1$ (with, in this case N=52), $$Z = e^{\frac{j.2.\pi}{N}}$$

is independent from $f_1$. Thus, the gain and the phase shift of the filter at the frequency $f_1$ is the same $\forall f_1$.

With this filter being linear, by noting the input of the filter E(Z) and the output of the filter S(Z), the following relationship occurs:

S(Z)=H(Z).E(Z)

In the case of the digital filtering of the samples $U_{1_n}$ at the input of the filter giving, at the output, the samples $U_{F_{1_n}}$, the following relationship occurs:

$U_{F_{1_n}} = U_{1_n} + U_{1_{n-1}} + a.U_{F_{1_{n-1}}}$, with a=0.7569801925.
$U_{1_{n-1}}$ and $U_{F_{1_{n-1}}}$ are initialised to 0.

Likewise, for the other filters which will be described below, the following relationships occur:

$U_{F_{2_n}} = U_{2_n} + U_{2_{n-1}} + a.U_{F_{2_{n-1}}}$, with a=117569801925.
$U_{2_{n-1}}$ and $U_{F_{2_{n-1}}}$ are initialised to 0.
$U_{F_{3_n}} = U_{3_n} + U_{3_{n-1}} + a.U_{F_{3_{n-1}}}$, with a=0.7569801925
$U_{3_{n-1}}$ and $U_{F_{3_{n-1}}}$ are initialised to 0.
$I_{F_{1_n}} = I_{1_n} + I_{1_{n-1}} + a.I_{F_{1_{n-1}}}$, with a=0.7569801925
$I_{1_{n-1}}$ and $I_{F_{1_{n-1}}}$ are initialised to 0.
$I_{F_{2_n}} = I_{2_n} + I_{2_{n-1}} + a.I_{F_{2_{n-1}}}$, with a=0.7569801925
$I_{2_{n-1}}$ and $I_{F_{2_{n-1}}}$ are initialised to 0.
$I_{F_{3_n}} = I_{3_n} + I_{3_{n-1}} + a.I_{F_{3_{n-1}}}$, with a=0.7569801925
$I_{3_{n-1}}$ and $I_{F_{3_{n-1}}}$ are initialised to 0.

If the fraud also falsifies the measurements of the third phase voltage V3, present on the third phase Ph3, the only reference phase available is the second phase Ph2.

The microcontroller 6 therefore first reconstitutes the first estimated samples for the first phase voltage V1, and calculates as above:

$$P_1 = \frac{1}{\sigma.N} \times \sum_{n=0}^{\sigma.N-1} U_{1_n} \times I_{1_n} \text{ (first Active Power)};$$

$$Q_1 = \frac{1}{\sigma.N} \times \sum_{n=0}^{\sigma.N-1} U_{F1_{n-N/4}} \times I_{F1_n} \text{ (first Reactive Power)};$$

$S_1 = V1_{RMS}.I1_{RMS}$ (Apparent Power).

The microcontroller 6 then again uses the second voltage samples $V_{2_n}$ to reconstitute the third estimated voltage samples $U_{3_n}$ and estimates at least one third electrical power consumed on the third phase Ph3 by using the third estimated voltage samples $U_{3_n}$.

For this, the microcontroller 6 first acquires a third index offset Δ3 corresponding to an expected theoretical phase shift without fraud between the third phase voltage V3 and the second phase voltage V2.

The expected theoretical phase shift is equal to −120°.

The third index offset Δ3 is a number of samples of which the second voltage samples $V_{2_n}$ must be offset to produce a phase voltage with the third phase voltage V3 by considering the expected theoretical phase shift, by considering that an index offset equal to the total number of samples per network period (that is N) would correspond to a phase shift of 360°.

In this case, the following therefore occurs:

Δ3=N/3.

If the index offset is an integer, i.e. if N/3 is an integer, the second voltage sample $V_{2_{n-N/3}}$ exists and the microcontroller 6 considers that:

$U_{3_n} = V_{2_{n-N/3}}$

However, if Δ3 is not an integer, $V_{2_{n-N/3}}$ does not exist, and the microcontroller 6 uses at least one second existing voltage sample to produce an estimated value of the third estimated voltage sample $U_{3_n}$.

In this case, the microcontroller 6 calculate the estimated value by making a linear interpolation between the second voltage sample $V_{2_{n-INT(\Delta3)-1}}$ and the second voltage sample $V_{2_{n-INT(\Delta3)}}$, i.e. between $V_{2_{n-INT(\frac{2N}{3})-1}}$ and $V_{2_{n-INT(\frac{N}{3})}}$.

The microcontroller 6 therefore determines the value of the sample $U_{3_n}$ at the precise moment n−N/3.

Here, in this case, N/3 is not an integer and the estimation by linear interpolation is done systematically.

The microcontroller 6 thus calculates:

$$P_3 = \frac{1}{\sigma.N} \times \sum_{n=0}^{\sigma.N-1} U_{3_n} \times I_{3_n} \text{ (third Active Power)};$$

$$Q_3 = \frac{1}{\sigma.N} \times \sum_{n=0}^{\sigma.N-1} U_{F3_{n-N/4}} \times I_{F3_n} \text{ (third Reactive Power)};$$

$S_3 = V3_{RMS}.I3_{RMS}$ (third Apparent Power).

The samples $U_{F3_n}$ and $I_{F3_n}$ are calculated by application of the Butterworth filter such as described above. The values $V3_{RMS}$ and $I3_{RMS}$ are obtained by calculation from the samples $U_{3_n}$ and $I_{3_n}$.

Figure 3:
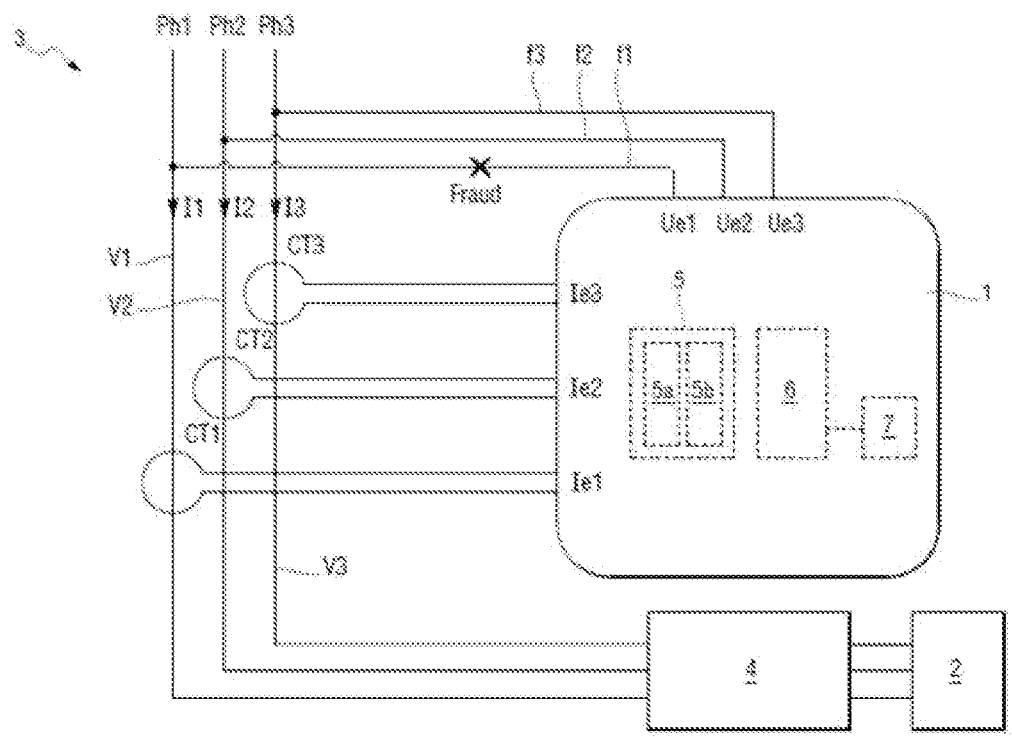
FIG. 3 represents a three-phase electricity meter according to the invention, in a three-wire configuration.

In reference to FIG. 3, this time a three-wire configuration is used.

The distribution network 3 comprises a first phase Ph1, a second phase Ph2 and a third phase Ph1, but no neutral.

The meter 1 comprises three voltage inputs Ue1, Ue2, Ue3 and three current inputs Ie1, Ie2, Ie3 (each current input comprising two ports).

The meter 1 again comprises measuring components 5a and analogue-to-digital converters 5b, and a microcontroller 6 connected to the analogue-to-digital converters 5b.

Again, a situation is used where the conductive wire f1 has been cut by a malicious user.

Therefore, the following occurs:

$V1_{RMS} < 40V$
and $I1_{RMS} < 5$ mA.

The microcontroller 6 therefore has detected a fraud which falsifies the measurements of the first phase voltage V1.

It is assumed that the fraud does not falsify the measurements of the second phase voltage V2, nor of the third phase voltage V3.

The implementation of the invention is slightly different in the three-wire configuration.

Figure 4:
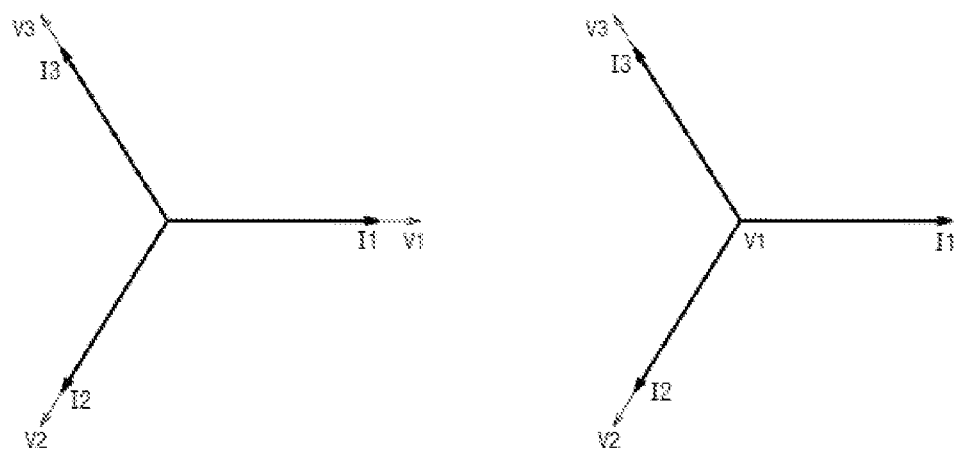
FIG. 4 represents, in the four-wire configuration, Fresnel diagrams of voltages and of currents measured on the phases in the normal case (on the left-hand side), and in case of fraud (on the right-hand side)
Figure 5:
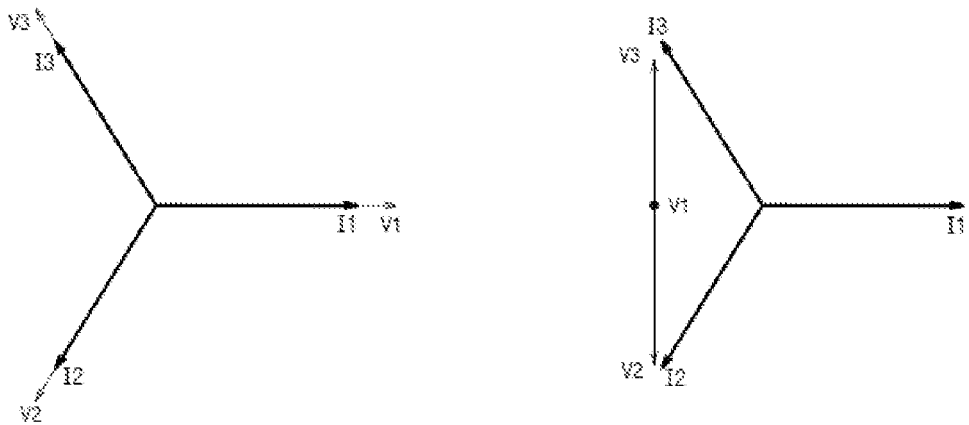
FIG. 5 is a figure similar to FIG. 4, but in three-wire configuration.

The reason for this difference is explained from the diagrams in FIGS. 4 and 5.

FIG. 4 represents, in the four-wire configuration in FIG. 1, the Fresnel diagram of voltages and currents in the normal case (on the left-hand side), and in case of fraud consisting of cutting the conductive wire f1 (on the right-hand side).

It is observed that the absence of a voltage measurement (V1 measurement in this case), has no impact on the amplitudes and the angles of the other voltages. In case of absence of two voltages, the same applies on the remaining voltage.

FIG. 5 represents, in the three-wire configuration in FIG. 3, the Fresnel diagram of voltages and currents in the normal case (on the left-hand side) and in case of fraud consisting of cutting the conductive wire f1 (on the right-hand side).

It is observed that the absence of a voltage measurement (V1 measurement in this case) has an impact on the amplitudes measured (which are decreased by a ratio $$\cos(\pm 30°) = \frac{\sqrt{3}}{2}\bigg),$$

but also on the angles measured of the other voltages (+30° on the V2 measurement and −30° on the V3 measurement).

The microcontroller 6 therefore first detects, preliminarily, if the distribution network 3 comprises or not a neutral in addition to the three phases.

If this is not the case, i.e. if the configuration is a three-wire configuration, the microcontroller 6 considers the factor $$\frac{\sqrt{3}}{2}$$

and phase shifts of +30° and −30° to estimate the electrical powers.

The microcontroller 6 will first calculate the second corrected voltage samples $U_{2_n}$ and the third corrected voltage samples $U_{3_n}$.

The microcontroller 6 will thus calculate from the second corrected voltage samples at least one second corrected electrical power consumed on the second phase Ph2 (in this case, a second Active Power, a second Reactive Power and a second Apparent Power) and, from, the third corrected voltage samples, at least one third corrected electrical power consumed on the third phase Ph3 (in this case, a third Active Power, a third Reactive Power and a third Apparent Power).

To calculate the second corrected voltage samples $U_{2_n}$, the microcontroller 6 acquires a second index offset Δ2 corresponding to an expected theoretical phase shift for the measurements of the second phase voltage V2 due to fraud.

For the second phase, the theoretical phase shift is equal to 30°, and therefore the second index offset Δ2 is such that:

Δ2=11*N*/12.

The microcontroller 6 first multiplies the second. voltage samples $V_{2_n}$ by a predetermined factor, in this case equal to $$\frac{2}{\sqrt{3}},$$

which enables to compensate for the amplitude which has been reduced by the inverse factor. Second resulting samples are obtained.

For each second corrected voltage sample $U_{2_n}$, associated with a second corrected index, if the second index offset is an integer, the microcontroller 6 confers to the second corrected voltage sample $U_{2_n}$, the value of a second resulting voltage sample having as a second index, the second corrected index offset from the second index offset. Otherwise, the microcontroller 6 confers to the second corrected voltage sample $U_{2_n}$, a value estimated from an interpolation using at least one second resulting voltage sample.

The "ideal" time offset, enabling to obtain the second corrected samples without calculating linear interpolation, therefore corresponds to the precise moment n−11N/12 in the case of the second voltage samples.

N must therefoe be divisible by 12, which is not the case here with N=52, such that the linear interpolations are calculated systematically.

Likewise, to calculate the third corrected voltage samples $U_{3_n}$, the microcontroller 6 acquires a third index offset corresponding to an expected theoretical phase shift for the measurements of the third phase voltage V3 due to fraud.

For the third phase, the theoretical offset is equal to −30°, therefore the third index offset Δ3 is such that:

Δ3=*N*/12.

The microcontroller 6 thus multiplies the third voltage samples $V_{3_n}$ by a predetermined factor, in this case equal to $$\frac{2}{\sqrt{3}},$$

which enables to compensate for the amplitude which has been reduced by the inverse factor. Third resulting samples are obtained.

For each third corrected sample $U_{3_n}$ associated with a third corrected index, if the third index offset is an integer, the microcontroller 6 confers to the third corrected voltage sample $U_{3_n}$, the value of a third resulting voltage sample having as a third index the third corrected index offset from the third index offset. Otherwise, the microcontroller 6 confers to the third corrected voltage sample, a value estimated from an interpolation using at least one third resulting voltage sample.

The "ideal" time offset, enabling to obtain the third corrected samples without calculating linear interpolation, therefore corresponds to the precise moment n−N/12 in the case of the third voltage samples.

N must therefore be divisible by 12, which is not the case here with N=52, such that the linear interpolations are calculated systematically.

The microcontroller 6 then calculates the second corrected electrical powers consumed on the second phase Ph2 and the third corrected electrical powers consumed on the third phase Ph3:

$$P_2 = \frac{1}{\sigma.N} \times \sum_{n=0}^{\sigma.N-1} U_{2_n} \times I_{2_n} \text{ (second corrected Active Power);}$$

$$Q_2 = \frac{1}{\sigma.N} \times \sum_{n=0}^{\sigma.N-1} U_{F2_{n-N/4}} \times I_{F2_n} \text{ (second corrected Reactive Power);}$$

$$S_2 = U2_{RMS}.I2_{RMS} \text{ (second corrected Apparent Power);}$$

$$P_3 = \frac{1}{\sigma.N} \times \sum_{n=0}^{\sigma.N-1} U_{3_n} \times I_{3_n} \text{ (third corrected Active Power);}$$

$$Q_3 = \frac{1}{\sigma.N} \times \sum_{n=0}^{\sigma.N-1} U_{F3_{n-N/4}} \times I_{F3_n} \text{ (third corrected Reactive Power);}$$

$S_3 = U3_{RMS}.I3_{RMS}$ (third corrected Apparent Power).

The samples $U_{F2_n}$ and $I_{F2_n}$ are calculated by application of the Butterworth filter described above, respectively on the second corrected voltage samples $U_{2_n}$ and on the second current samples $I_{2_n}$.

Likewise, the samples $U_{F3_n}$ and $I_{F2_n}$ are calculated by application of the Butterworth filter described above, respectively on the third corrected voltage samples $U_{3_n}$ and on the third current samples $I_{3_n}$.

The first estimated voltage samples $U_{1_n}$ are thus reconstituted by applying exactly the same method as in the four-wire configuration, on all of a period of 1 s. This time, however, these are the second corrected voltage samples $U_{2_n}$ which are used.

The microcontroller 6 thus calculates the first electrical powers consumed on the first phase Ph1 as follows:

$$P_1 = \frac{1}{\sigma.N} \times \sum_{n=0}^{\sigma.N-1} U_{1_n} \times I_{1_n} \text{ (first Active Power);}$$

$$Q_1 = \frac{1}{\sigma.N} \times \sum_{n=0}^{\sigma.N-1} U_{F1_{n-N/4}} \times I_{F1_n} \text{ (first Reactive Power);}$$

$$S_1 = V1_{RMS}.I1_{RMS} \text{ (first Apparent Power).}$$

The samples $U_{F1_n}$ and $I_{F1_n}$ are calculated by application of the Butterworth filter described above, respectively on the first estimated voltage samples $U_{1_n}$ and on the first current samples $I_{1_n}$.

As can be seen, the microcontroller 6 must detect if the configuration is a four-wire or a three-wire configuration, i.e. if the distribution network 3 comprises, or not, a neutral in addition to the three phases. The estimation of the first electrical powers indeed differs according to the actual configuration. Likewise, the application of the correction on the second electrical powers and on the third electrical powers depends on the configuration.

The power estimation method therefore comprises a preliminary step consisting of detecting if the network 3 and the meter 1 are located in a four-wire or a three-wire configuration.

For this, after having detected a fraud on the first phase Ph1, the microcontroller 6 measures the angle φ between the two remaining voltages, i.e. between the second phase voltage V2 and the third phase voltage V3 (in the case where the measurements of the second phase voltage V2 and the measurements of the third phase voltage V3 are not falsified).

The microcontroller 6 thus determines if the angle is in an absolute value close to 180° and, if this is the case, detects a three-wire configuration.

The microcontroller 6 verifies if the angle φ belongs, or not, to the predefined interval:

180°−X°<|φ|<180°+X°.

X is a positive predefined value, and less than 30. For example, the following occurs: X=20.

If the angle φ belongs to the predefined interval, the microcontroller 6 considers that the angle φ is in an absolute value close to 180° and therefore detects a three-wire configuration. Otherwise, the microcontroller 6 detects a four-wire configuration.

It is noted that, in the three-wire configuration, it is possible to estimate the powers which would have been consumed in the absence of fraud, only if only one of the voltage inputs is missing (fraud on one single phase, as in 3 wires, if two phases are missing, the meter is no longer supplied), while in the four-wire configuration, it is possible to estimate them in the case of two missing voltage inputs.

It is also noted that it is possible that, in the case where the microcontroller 6 detects that two voltage inputs are missing (fraud on two phases), the microcontroller 6 systematically detects the four-wire configuration (since the meter 1 is supplied); the meter 1 thus implements the estimation method under the corresponding conditions.

Indeed, the meters automatically switches off when the configuration is a three-wire configuration and that two voltages are missing.

Figure 6:
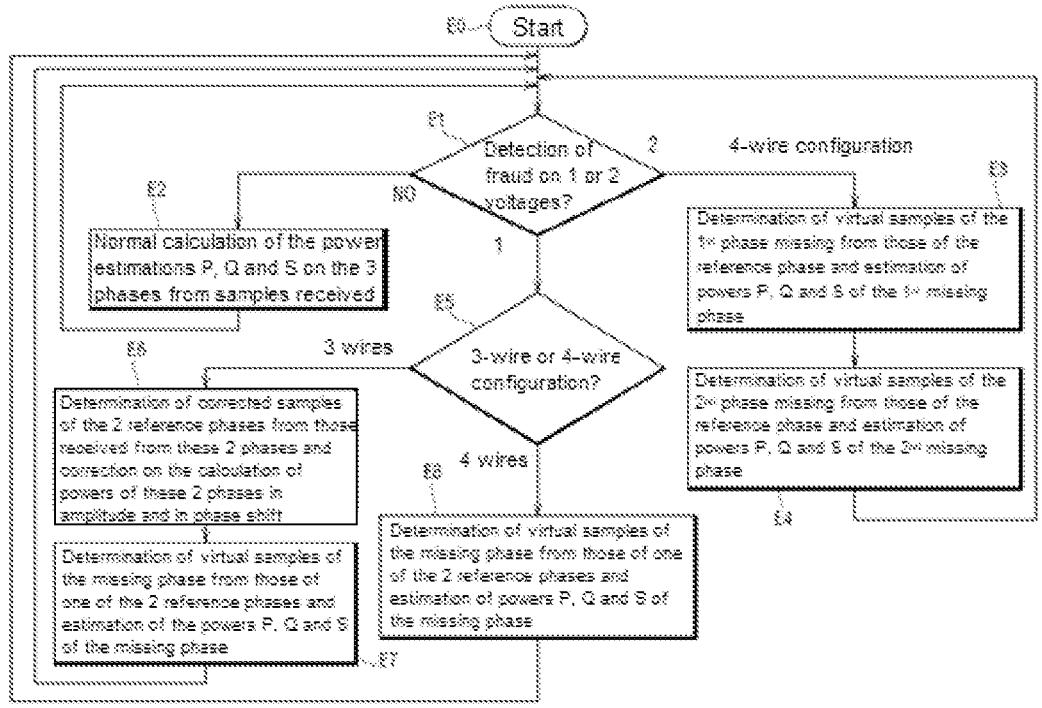
FIG. 6 is a flowchart representing the steps of the power estimation method according to the invention.

The different steps of the estimation method can be seen in FIG. 6.

The method starts at step E0.

The microcontroller 6 attempts to detect at least one fraud on one of the three phases (step E1).

If no fraud is detected, the microcontroller 6 normally calculates the estimations of the Active Power, of the Reactive Power and of the Apparent Power to each of the three phases, by using the voltage samples and the current samples transmitted by the analogue-to-digital converters 5b (step E2) No voltage sample reconstruction is necessary.

The calculation of the power estimations is done at regular intervals (cycle of 1 s, for example).

The method returns to step E1.

In step E1, if the microcontroller 6 detects a fraud on two phases, the microcontroller 6 directly deduces from it that the configuration is a four-wire configuration (see what has just been explained).

It is assumed, for example, that the measurements of the first phase voltage V1 and the measurements of the third phase voltage V3 are falsifed.

The microcontroller 6 first reconstitutes the first voltage samples estimated from the second voltage samples, images of the second phase voltage (reference voltage). The microcontroller 6 thus estimates the first electrical powers consumed on the first phase (step E3).

Then, the microcontroller 6 reconstitutes the third voltage samples estimated from the second voltage samples, images of the second phase voltage (reference voltage) The microcontroller 6 thus estimates the third electrical powers consumed on the third phase (step E4).

The calculation of the power estimations is done at regular intervals (cycle of is, for example).

The method returns to step E1.

It is now assumed that in step E1, the microcontroller 6 detects a fraud on one single phase; it is assumed that the measurements of the first phase voltage are falsified.

The microcontroller 6 thus detects if the network 3 and the meter 1 are located in a four-wire or a three-wire configuration (step E5).

If the three-wire configuration is detected, the microcontroller 6 produces second corrected voltage samples for the second phase Ph2 (correction in amplitude and in phase), and uses the second corrected voltage samples to calculate the second corrected electrical powers consumed on the second phase Ph2. Likewise, the microcontroller 6 produces third corrected voltage samples for the third phase Ph3, and uses the third corrected voltage samples to calculate the third corrected electrical powers consumed on the third phase Ph3: step E6.

The microcontroller 6 then reconstitutes the first voltage samples estimated from second corrected voltage samples (or from third corrected voltage samples), and thus estimates the first electrical powers consumed on the first phase (step E7).

The calculation of the power estimations is done at regular intervals (cycle of is, for example).

The method returns to step E1.

In seen E5, if the four-wire configuration is detected, the microcontroller 6 reconstitutes the first voltage samples estimated from second voltage samples (or from third voltage samples), and thus estimates the first electrical powers consumed on the first phase (step E8).

The calculation of the power estimations is done at regular intervals (cycle of 1s, for example).

The method returns to step E1.

Now, the power estimation method according to a second embodiment of the invention is described.

It is again considered that fraud falsifies the measurements of the first phase voltage V1 present on the first phase Ph1, without falsifying the measurements of the second phase voltage V2 present on the second phase Ph2. The second phase voltage V2 is again the reference voltage.

The main difference between the second embodiment and the first embodiment relates to the reconstitution step, which is implemented to reconstitute the first estimated voltage samples.

A reference table has been prerecorded in the memory 7. This reference table contains reference samples of a sinusoidal function, in this case of the cosine function.

Each reference sample is written $\cos(\theta i)$, and therefore has as a value, the value of the cosine (y-axis) according to the angle $\theta i$ (x-axis).

The following occurs: $\cos(\theta 0)=1$.

The value of i corresponds to the position in the table of the value $\cos(\theta i)$. The value of i is also the index of the reference sample $\cos(\theta i)$.

The angle pitch $\theta i$ is, for example, equal to 0.1° (i.e. that for all, i, $\theta i+1\ \theta i=0.1°$.

It is noted that it is sufficient that the reference table contains reference samples for i varying from 0° to 90°. The values over ¼ of the period indeed suffice to reconstitute the whole period by horizontal symmetry along the x-axis and vertical symmetry along the y-axis.

To reconstitute the first estimated voltage samples, the microcontroller 6 first acquires the reference table.

The microcontroller 6 thus measures a maximum value of the second phase voltage V2 and multiplies the reference samples by an amplitude factor proportional to the maximum value to obtain resulting reference samples.

In this case, the amplitude factor is equal to the maximum value $V2_{max}$, which is such that:

$$V2_{max} = \sqrt{2} \cdot V2_{RMS}, \text{ in the 4-wire configuration, and}$$

$$V2_{max} = \frac{2 \cdot \sqrt{2}}{\sqrt{3}} \cdot V2_{RMS}, \text{ in the 3-wire configuration.}$$

Then, for each first estimated voltage sample associated with a first index, the microcontroller 6 confers to said first estimated voltage sample, the value of a resulting reference sample having as an index, the first index offset from an index offset corresponding to an expected theoretical phase shift without fraud between the first phase voltage and the second phase voltage.

The microcontroller 6 therefore offsets the reference samples, contained in the reference table, by ±120° (±0.1°).

This method enables to avoid any calculation and drastically saves CPU time.

The microcontroller 6 thus estimates the first electrical powers consumed on the first phase by using the first estimated voltage samples.

In a variant, and whatever the configuration (four-wire or three-wire), in the case where fraud only affects the first phase Ph1, it is possible, to estimate the first electrical powers, to reconstitute the first estimated voltage samples from both second voltage samples (second phase voltage V2) and third voltage samples (third phase voltage V3).

The microcontroller 6 calculates for this, an arithmetic average of the first estimated voltage samples, reconstituted from second voltage samples, and from first estimated voltage samples, reconstituted from third voltage samples, to produce first consolidated voltage samples, which are used to estimate the first electrical powers.

Naturally, the invention is not limited to the embodiments described, but comprises any variant entering into the scope of the invention such as defined by the claims.

It is indicated that the expected theoretical phase shift without fraud, between the first phase voltage and the second phase voltage, is equal to +120°. Naturally, this value depends on phases which are called "first phase" and "second phase"; the expected theoretical phase shift could be equal to −120°. The first index offset $\Delta 1$ could therefore be such that:

$$\Delta 1 = N/3$$

Likewise, the expected theoretical phase shift for the measurements of the second phase voltage due to fraud could be equal to −30°, and the expected theoretical phase shift for the measurements of the third phase voltage due to fraud could be equal to +30°.

The architecture of the meter could be different from that described in this case. The analogue-to-digital converter (s) could thus, for example, be integrated in the microcontroller.

The invention claimed is:

1. A power_estimation method, implemented in a three-phase electricity meter, and comprising the steps of:
    detecting a fraud which falsifies measurements of a first phase voltage present on a first phase of a distribution network, without falsifying measurements of a second phase voltage present on a second phase of the distribution network;
    reconstituting first estimated voltage samples, images over time of the first phase voltage, from second voltage samples, images over time of the second phase voltage, the second voltage samples being offset over time by an expected theoretical phase shift without fraud between the first phase voltage and the second phase voltage;
    estimating at least one first electrical power consumed on the first phase by using the first estimated voltage samples.

2. The power estimation method according to claim 1, wherein the reconstitution comprises the steps of acquiring a first index offset corresponding to the expected theoretical phase shift and, for each first estimated voltage sample associated with a first index:
    if the first index offset is an integer, of conferring to the first estimated voltage sample, a value of a second voltage sample having as a second index, the first index offset from the first index offset;
    otherwise, of conferring to the first estimated voltage sample, an estimated value obtained from an interpolation using at least one second voltage sample.

3. The power estimation method according to claim 2, wherein the first index offset $\Delta 1$ is such that:

$$\Delta 1 = 2N/3 \text{ or } \Delta 1 = N/3$$

where N is a number of first voltage samples per period of the first phase voltage, and in which, if $\neq 1$ is an integer, the following occurs:

$$U_{1_n} = V_{2_{n-\Delta 1}}.$$

4. The power estimation method according to claim 3, comprising the step, if $\Delta 1$ s not an integer, of calculating the estimated value by making a linear interpolation between the second voltage sample $V_{2_{n-INT(\Delta1)-1}}$ and the second voltage sample $V_{2_{n-INT(\Delta1)}}$, *INT being the integer part function.*

5. The power estimation method according to claim 1, wherein the reconstitution comprises the steps of:
   acquiring a prerecorded reference table and containing reference samples of a sinusoidal signal;
   measuring a maximum value of the second phase voltage and multiplying the reference samples by an amplitude factor proportional to the maximum value to obtain resulting reference samples, and
   for each first estimated voltage sample associated with a first index, conferring to the first estimated voltage sample, a value of a resulting reference sample having as an index, the first index offset from an index offset corresponding to the expected theoretical phase shift without fraud between the first phase voltage and the second phase voltage.

6. The power estimation method according to claim 1, wherein the at least one first electrical power comprises a first Active Power estimated from first estimated voltage samples and from first current samples, images over time of a first phase current circulating on the first phase, and/or a first Reactive Power estimated from samples of a level on a fundamental frequency of the first phase voltage and from samples of a level on a fundamental frequency of the first phase current, and/or a first Apparent Power estimated from an effective value of the first phase voltage and from an effective value of the first phase current.

7. The power estimation method according to claim 6, wherein the samples of the level on the fundamental frequency of the first phase voltage and the samples of the level on the fundamental frequency of the first phase current are obtained by application of a low-pass filtering respectively on the first estimated voltage samples and on the first current samples.

8. The power estimation method according to claim 7, wherein the low-pass filtering is a first-order Butterworth filter having a Z transform H(Z) such that:

$$H(Z) = \frac{1+Z^{-1}}{1-a.Z^{-1}}, \text{ with:}$$

$$a = 0.7569801925.$$

9. The power estimation method according to claim 1, further comprising the steps, if the fraud also falsifies the measurements of a third phase voltage, present on a third phase, of again using the second voltage samples to reconstitute third estimated voltage samples, images over time of the third phase voltage, and of estimating at least one third electrical power consumed on the third phase by using the third estimated voltage samples.

10. The power estimation method according to claim 1, further comprising the steps of detecting if the distribution network comprises, or not, a neutral in addition to the three phases and, if this is not the case, of calculating second corrected voltage samples, and of calculating at least one second corrected electrical power consumed on the second phase from the second corrected voltage samples.

11. The power estimation method according to claim 10, wherein the calculation of the second corrected voltage samples comprises the steps of acquiring a second index offset corresponding to an expected theoretical phase shift for the measurements of the second phase voltage due to fraud, of multiplying the second voltage samples by a predetermined factor to obtain second resulting samples and, for each second corrected voltage sample associated with a second corrected index:
   if the second index offset is an integer, of conferring to the second corrected voltage sample, a value of a second resulting voltage sample having, as a second index, the second corrected index offset from the second index offset;
   otherwise, of conferring to the second corrected voltage sample, an estimated value obtained from an interpolation using at least one second resulting voltage sample.

12. The power estimation method according to claim 10, wherein an absence of neutral is detected when an angle o between the second phase voltage and the third phase voltage is such that:

$$180°-X° < |\varphi| < 180°+X°,$$

X being a positive predefined value and less than 30.

13. The power estimation method according to claim 1, wherein fraud is detected when the first phase voltage is less than a predefined voltage threshold, while the first phase current is greater than a predefined current threshold.

14. A three-phase electricity meter, comprising a processing component arranged to implement the power estimation method according to claim 1.

15. A non-transitory recording medium which can be read by a computer, on which a computer program comprising instruction which causes the processing component of a three-phase electricity meter, comprising a processing component arranged to implement the power estimation method according to claim 1 to execute the steps of the power estimation method, is recorded.

* * * * *